(12) United States Patent
Araki et al.

(10) Patent No.: US 7,358,151 B2
(45) Date of Patent: Apr. 15, 2008

(54) MICROELECTROMECHANICAL SYSTEM MICROPHONE FABRICATION INCLUDING SIGNAL PROCESSING CIRCUITRY ON COMMON SUBSTRATE

(75) Inventors: Shinichi Araki, Sunnyvale, CA (US); Martin Kuhn, Palo Alto, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 296 days.

(21) Appl. No.: 11/022,457

(22) Filed: Dec. 21, 2004

(65) Prior Publication Data

US 2006/0134904 A1    Jun. 22, 2006

(51) Int. Cl.
*H01L 21/4763* (2006.01)
(52) U.S. Cl. .............. 438/453; 438/48; 438/622; 438/662; 257/414
(58) Field of Classification Search ............... 438/48, 438/453, 622, 662
See application file for complete search history.

(56) References Cited

U.S. PATENT DOCUMENTS

2004/0012057 A1 * 1/2004 Bennett et al. ............ 257/414
2004/0145056 A1   7/2004 Gabriel et al.
2004/0146810 A1   7/2004 Gabriel et al.
2006/0157841 A1 * 7/2006 Minervini ................. 257/680

OTHER PUBLICATIONS

Allen, Roger, MEMS Microphone-Amp Chip Breaks Acoustics Ground; Electronic Design; Jun. 9, 2003; pp. 1-2.
Signal Systems Corporation; About Signal Systems Corporation; pp. 1-4; www.signalsystemscorp.com.

* cited by examiner

*Primary Examiner*—Zandra V. Smith
*Assistant Examiner*—Pamela E Perkins
(74) *Attorney, Agent, or Firm*—Charles J. Kulas; Brian N. Young; Trellis IP Law Group, PC

(57) ABSTRACT

A MEMS microphone is formed on a single substrate that also includes microelectronic circuitry. High-temperature tolerance metals are used to form contacts in a metallization step before performing deep reactive ion etching and back patterning steps to form a MEMS microphone. High-temperature tolerant metals such as titanium, tungsten, chromium, etc. can be used for the contacts. Another approach uses laser annealing in place of deep reactive ion etching so that high-temperature tolerant metals do not need to be used in earlier metallization steps. Different orderings for device, circuit, and metallization series of steps are presented.

15 Claims, 4 Drawing Sheets

MICROELECTROMECHANICAL SYSTEM MICROPHONE FABRICATION INCLUDING SIGNAL PROCESSING CIRCUITRY ON COMMON SUBSTRATE

BACKGROUND

This invention is related in general to microelectronic device fabrication and more specifically to fabrication of a microelectromechanical system (MEMS) microphone including signal processing circuitry on a common substrate.

MEMS devices are desirable because of their small size, potential lower cost, and higher performance. Some types of devices that have been built using MEMS techniques include accelerometers, gyroscopes, temperature sensors, chemical sensors, AFM (atomic force microscope) probes, micro-lenses, combdrive actuators, piezoelectric actuators, etc. Such devices can be integrated with microelectronics, packaging, optics, and other devices or components to realize complete MEMS systems. Some examples of MEMS systems include inertial measurement units, optical processors, sensor suites, and micro robots.

Although MEMS techniques, and other related fields such as nanotechnology, have been used successfully to fabricate many types of devices, there are still various problems to be overcome in manufacturing increasingly complex devices. For example, it is desirable to fabricate MEMS devices that include auxiliary electronics or circuits. If the circuits can be formed on the same substrate as the MEMS device, then advantages in smaller size, lower cost, and efficient manufacture may be realized. However, the combination of a MEMS device and microelectronic circuit on a common substrate can be difficult to fabricate due to microelectronic process limitations.

SUMMARY

An embodiment of the invention provides a MEMS microphone formed on a single substrate that also includes microelectronic circuitry. For example, signal processing and/or conditioning, noise canceling or reduction, and other functions can be included with the MEMS microphone in an integral unit on a single substrate.

In one embodiment, complimentary metal-oxide-semiconductor (CMOS) circuitry is formed in conjunction with MEMS device fabrication. High-temperature tolerance metals are used to form contacts in a metallization step before performing deep reactive ion etching and back patterning steps to form a MEMS microphone. High-temperature tolerant metals such as titanium, tungsten, chromium, etc. can be used for the contacts. Another approach uses laser annealing in place of deep reactive ion etching so that high-temperature tolerant metals do not need to be used in earlier metallization steps.

One embodiment of the invention provides a method for fabricating a microelectromechanical device, the method comprising the following: forming at least a portion of a microelectromechanical device on a substrate; fabricating at least a portion of a microelectronic circuit on the substrate including a circuit metallization process; and completing formation of the microelectromechanical device including a device metallization process.

Another embodiment of the invention provides a method for fabricating a microelectromechanical device, the method comprising the following: fabricating at least a portion of a microelectronic circuit on the substrate including a circuit metallization process that uses a high temperature metallization material; and forming a microelectromechanical device including a device metallization process.

Another embodiment of the invention provides a method for fabricating a microelectromechanical device, the method comprising the following: fabricating a microelectronic circuit on a substrate including a circuit metallization process; forming at least a portion of a microelectromechanical device using an annealing process; and completing formation of the microelectromechanical device using a device metallization process.

DETAILED DESCRIPTION

FIGS. 1-7 illustrate basic phases in a fabrication of an apparatus that includes a microelectromechanical (MEMS) device and auxiliary microelectronic circuitry on a single substrate. An embodiment of the invention provides a MEMS microphone with on-substrate signal processing circuitry. Note that although embodiments of the invention are discussed primarily with respect to a MEMS microphone with signal processing circuitry, many other types of devices using different circuitry can be achieved. Various steps described herein provide at least three different ways of forming a MEMS device and circuitry, with attention to the placement and ordering of metallization steps used in both MEMS device fabrication and microelectronic circuit fabrication. Other applications and advantages of the process techniques of the present invention are possible and are within the scope of the invention. Note that the diagrams are not to scale and are intended to show only relative positions among layers and areas.

Figure 1:
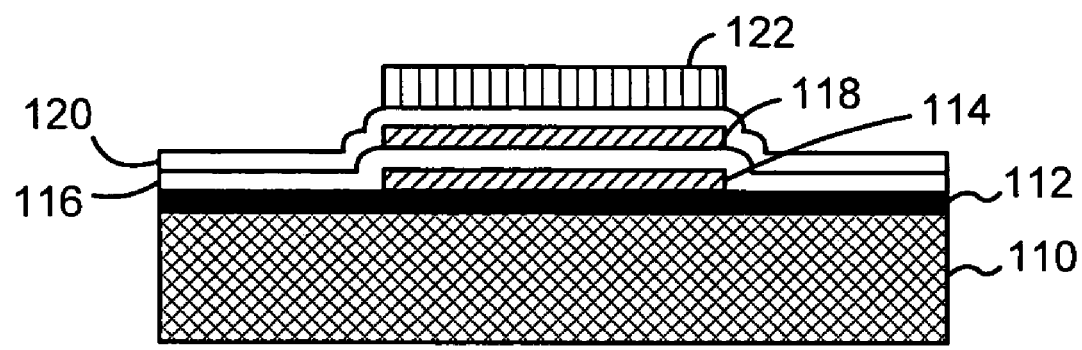
FIG. 1 is an illustration of a first phase in a device fabrication process.

FIG. 1 shows a first phase in the fabrication of a MEMS microphone device and auxiliary circuitry on a common substrate. In FIG. 1, several layers have been deposited on silicon substrate 110, including nitride layer 112, first polysilicon chemical vapor deposition (CVD) layer 114, first phosphorous silicate glass (PSG) layer 116, second polysilicon CVD layer 118, second PSG layer 120, and resist mask 122. Such layers can be formed by any means as is known in the art and also by future processes that become known.

Figure 2:
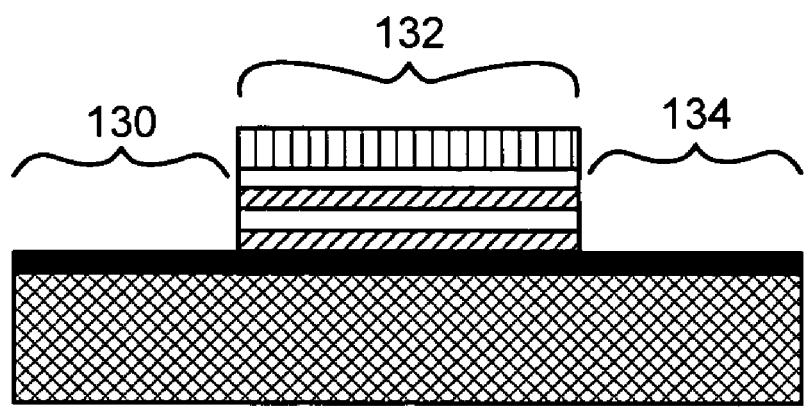
FIG. 2 is an illustration of a second phase in a device fabrication process.

FIG. 2 shows a second phase whereby pre-active etching of non-masked areas results in removal of sacrificial PSG layers 116 and 120 at areas 130 and 134 in order to leave the area 132 under the resist mask intact. In one embodiment, the layers remaining at area 132 are used in subsequent steps to create a condenser-type MEMS microphone.

Figure 3:
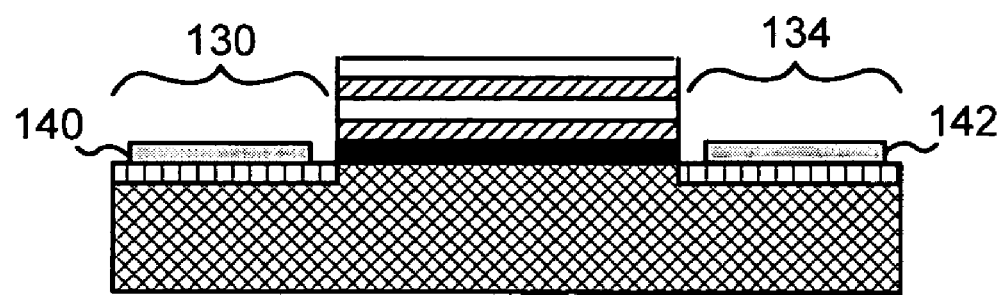
FIG. 3 is an illustration of a third phase in a device fabrication process.

FIG. 3 shows a third phase whereby steps are performed to produce microelectronic circuitry, such as complimentary metal-oxide-semiconductor (CMOS) circuitry at the areas 130 and 134. Note that FIGS. 1-7 show a cross-section of the device as is typical in portraying semiconductor process steps. In general any type of arrangement, layout, topology, or design of a MEMS and semiconductor device can be achieved. Such a device may deviate greatly from the examples provided herein. For example, although CMOS circuitry is shown formed on either side of the MEMS layers, other designs may have circuitry at only one or more sides or positions of a MEMS device. Circuitry can also be interspersed with MEMS devices, such as where an array or other plurality of MEMS devices is provided on a substrate, and circuitry is interspersed among or between the MEMS devices. Any type of MEMS device can be fabricated as can any type of microelectronic circuitry. Although an embodiment of the invention contemplates using CMOS process technology, any other type of technology (e.g., MOS, bipolar, etc.) can be used.

In one embodiment, the phase of CMOS circuitry fabrication that is illustrated in FIG. 3 includes a metallization or wiring step using a high-temperature melting point metal such as titanium, tungsten, chromium, etc. rather than a relatively low-temperature melting point metal such as aluminum. This is so that subsequent MEMS fabrication steps, discussed below, can be used even if the subsequent MEMS steps require high temperatures. Alternatively, if the circuitry metallization process steps use a lower temperature metal, then subsequent MEMS fabrication steps must not subject the circuitry metallization to high temperature, in which case other techniques, such as laser annealing, can be used in place of the MEMS high-temperature steps.

Figure 4:
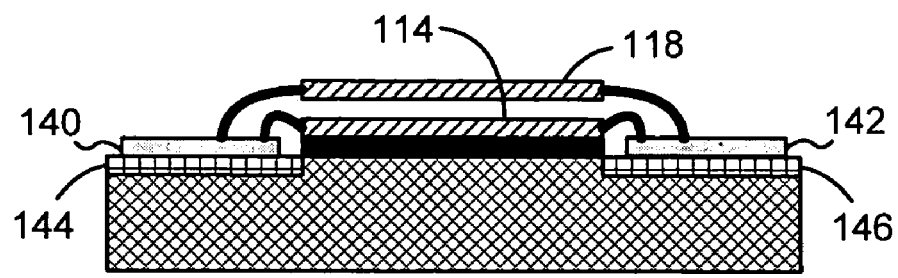
FIG. 4 is an illustration of a fourth phase in a device fabrication process.

FIG. 4 illustrates a phase after the MEMS sacrificial layers have been removed so that polysilicon CVD layers 114 and 118 remain. The layers 114 and 118 are separated by a dielectric (e.g., air) by means not shown, but which designs are well-known in the art. Note that any of many types of designs for a MEMS microphone or other device are possible. Designs by Sony Corporation, Akustika, Inc., Sonion A/S, Phone-Or, etc., are examples of MEMS devices. FIG. 4 also illustrates a MEMS metallization step whereby the layers 114 and 118 are electrically joined to circuit metallization layers 140 and 142, which provide interconnection with circuitry in layers 144 and 146. As mentioned, the illustrations in these Figures is only for purposes of example and other approaches can use any suitable design for MEMS, circuitry, wiring, and other device characteristics.

Figure 5:
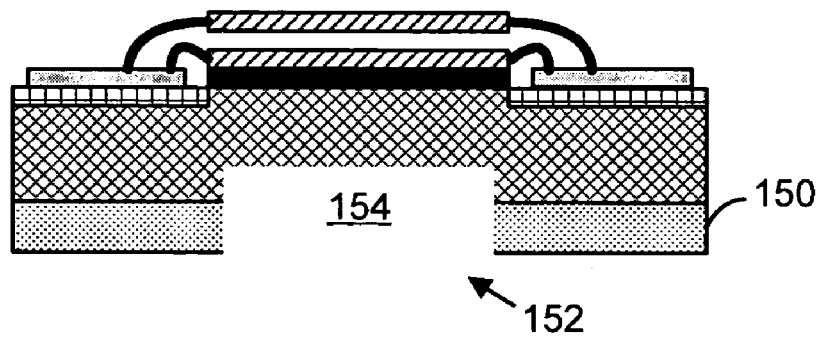
FIG. 5 is an illustration of a fifth phase in a device fabrication process.

FIG. 5 shows the result of a deep reactive ion etching step where resist layer 150 is used to mask all but a central backing portion 152 of the substrate so that ion etching creates a starting well or space below the MEMS layers.

Figure 6:
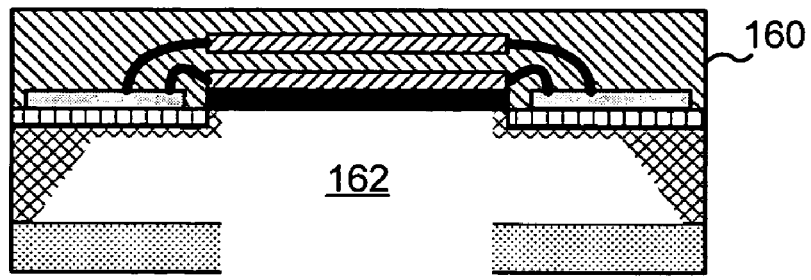
FIG. 6 is an illustration of a sixth phase in a device fabrication process.

FIG. 6 shows a phase where protective resist layer 160 is applied to the top of the device while alkaline etching and silicon nitride steps are used to create back cavity 162.

Figure 7:
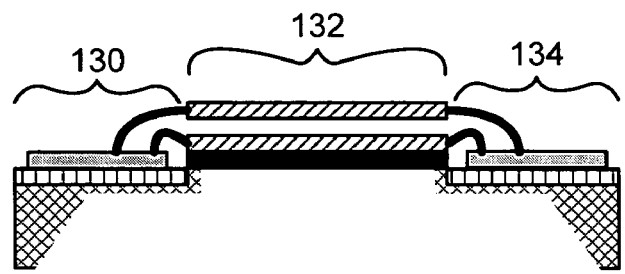
FIG. 7 is an illustration of a seventh phase in a device fabrication process.

FIG. 7 shows the final device where top and bottom resist layers have been removed to result in a MEMS microphone structure at 132 and circuitry at areas 130 and 134. In one embodiment, circuitry areas are used to form circuits for noise reduction, canceling, or suppression; signal conditioning and signal processing, etc. as desired.

Figure 8:
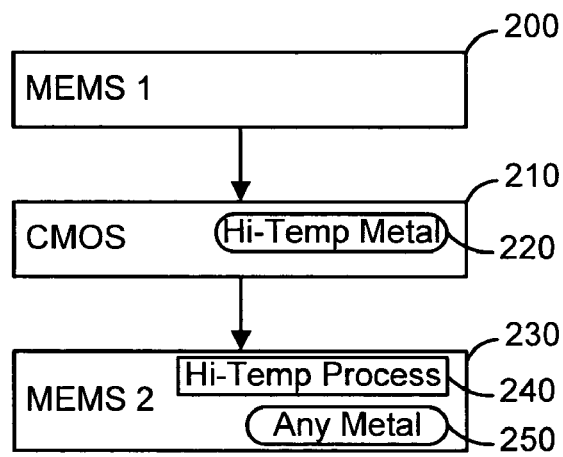
FIG. 8 shows a first order of basic process steps.

FIG. 8 illustrates, in block diagram form, the basic process order discussed in connection with FIGS. 1-7, above. In FIG. 8 (and FIGS. 9-11 as discussed below), a first MEMS series of steps (or phases) is performed as discussed in reference to FIGS. 1 and 2. At 210 a series of steps to fabricate CMOS circuitry is performed that corresponds to FIG. 3. Circuitry metallization 220 is shown as part of the CMOS fabrication phase and corresponds to FIG. 3, also. A second and final set of MEMS fabrication steps is represented by 230 which includes a device metallization process 240. Device metallization process 240 corresponds to FIG. 4, above, and final set of MEMS fabrication steps corresponds to FIGS. 4-6. Note that the details provided in FIGS. 1-7 are merely one example of the types of steps that can correspond to the various blocks in FIGS. 8-11.

In FIG. 8, circuitry metallization 220 and device metallization 240 are required to use a metal with a high melting point since subsequent MEMS fabrication steps use high temperature processes.

Figure 9:
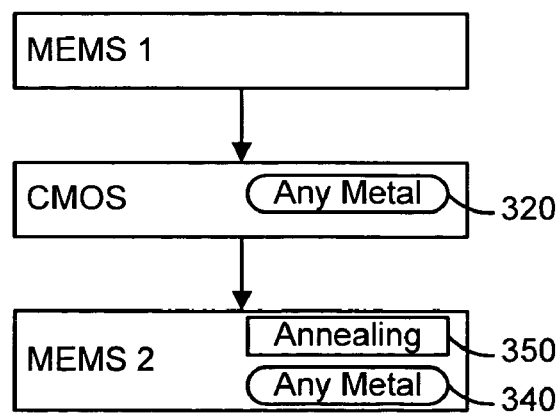
FIG. 9 shows a second order of basic process steps.

FIG. 9 illustrates a case where any type of metal (including lower-melting-point metals) can be used at 320 and 340, since the high-temperature back patterning steps of the final MEMS fabrication are replaced with laser annealing, which prevents high temperatures that cause the metallization layers to melt or become damaged.

Figure 10:
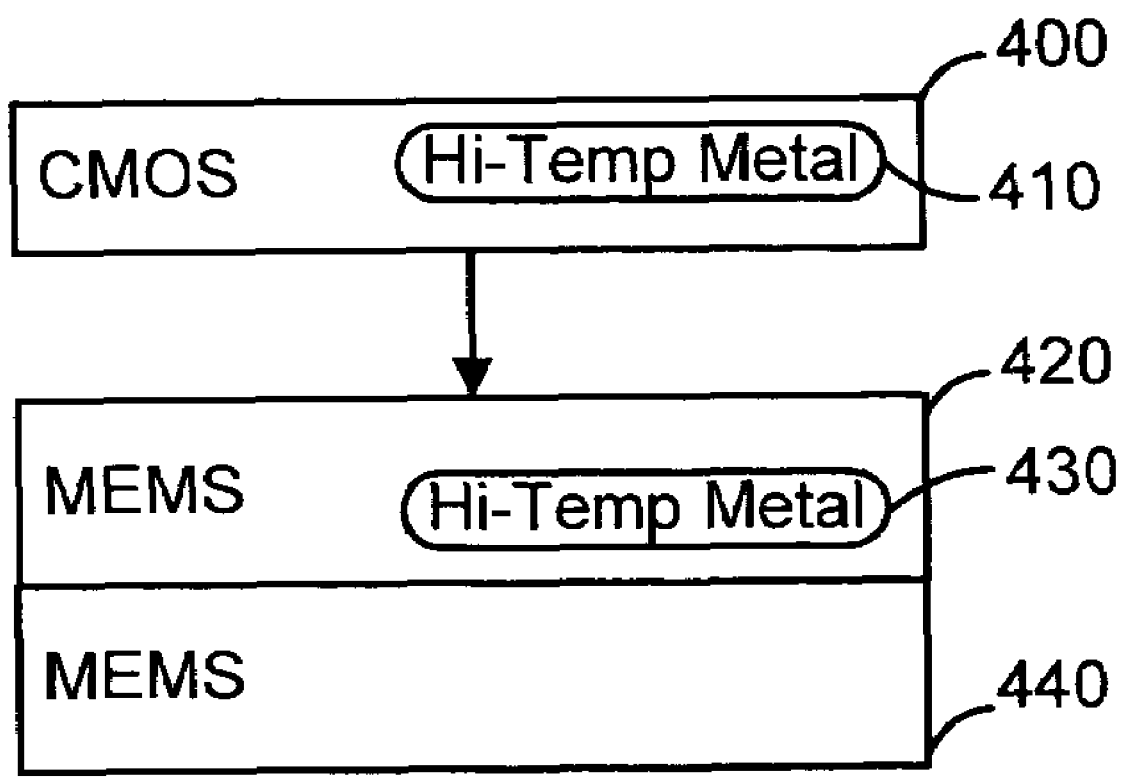
FIG. 10 shows a third order of basic process steps.

FIG. 10 shows a different process order whereby CMOS fabrication 400 occurs first along with the CMOS, or circuit, metallization 410 using a high-temperature metal. Next, a first set of device fabrication steps 420 is used along with device metallization 430. Finally, the final steps of device fabrication 440 are performed. High-temperature metal must be used in this approach unless the high-temperature steps of device fabrication 440 can be replaced with other steps (e.g., laser annealing) that do not cause high temperatures at existing metallization layers.

Although the invention has been described with respect to specific embodiments thereof, these embodiments are merely illustrative, and not restrictive, of the invention. For example, the block diagrams of FIGS. 8-11 are not intended to be limited to the selection, order, and/or arrangement of steps discussed in FIGS. 1-7. In general, each MEMS or circuit fabrication block in FIGS. 8-11 can include any number, type and order of steps designed to form a structure associated with a MEMS or circuit device. Similarly, the metallization blocks can include any number or type of metallization steps.

Any suitable programming language can be used to implement the routines of the present invention including C, C++, assembly language, etc. Different programming techniques can be employed such as procedural or object oriented. The routines can execute on a single processing device or multiple processors. Although the steps, operations, or computations may be presented in a specific order, this order may be changed in different embodiments. In some embodiments, multiple steps shown as sequential in this specification can be performed at the same time. The sequence of operations described herein can be interrupted, suspended, or otherwise controlled by another process, such as an operating system, kernel, etc. The routines can operate in an operating system environment or as stand-alone routines occupying all, or a substantial part, of the system processing.

Although specific types and numbers of tools, utilities, routines or other programs and functionality has been presented, the functionality provided by embodiments of the invention can be provided by many different design approaches. For example, more or less than six tools can be used. A different ordering of functions (i.e., tool execution) may be desirable in different embodiments. Different designs can include combined functionality of several tools into one, or functions can be allocated to more than six tools. It may be possible and desirable to omit functions described herein in some embodiments. Different embodiments can include more or less automation and more or less manual intervention. Features can be added, deleted, or modified, as, for example, to accommodate future computer operating systems, applications, utilities, drivers or other components.

In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

What is claimed is:

1. A method comprising:
    forming at least a portion of a microelectromechanical device on a substrate;
    fabricating at least a portion of a microelectronic circuit on the substrate, wherein fabricating includes a circuit metallization process; and
    subsequent to the fabricating, completing formation of the microelectromechanical device by using a device metallization process to fabricate an electrically conductive trace that carries electric signals between the microelectromechanical device and the microelectronic circuit, wherein completing formation of the microelectromechanical device includes using a laser.

2. The method of claim 1, wherein the microelectromechanical device includes a microphone.

3. The method of claim 1, wherein the microelectromechanical device includes a condenser microphone.

4. The method of claim 1, wherein the circuit metallization process includes using a high-temperature metallization material.

5. The method of claim 4, wherein the high-temperature metallization material includes tungsten.

6. The method of claim 4, wherein the high-temperature metallization material includes tungsten silicide.

7. The method of claim 4, wherein the high-temperature metallization material includes chromium.

8. The method of claim 4, wherein the high-temperature metallization material includes titanium.

9. The method of claim 1, wherein the microelectronic circuit includes a noise-reduction circuit.

10. The method of claim 1, wherein the microelectronic circuit includes a signal conditioning circuit.

11. The method of claim 1, wherein the circuit metallization process includes using a low-temperature metallization material.

12. A method comprising:
    fabricating at least a portion of a microelectronic circuit on a substrate including a circuit metallization process, wherein the circuit metallization process uses a high temperature metallization material, wherein the high-temperature metallization material includes tungsten, tungsten silicide, chromium, and/or titanium; and
    subsequent to the fabricating step, forming a microelectromechanical device including a device metallization process, wherein the microelectronic circuit includes a noise-reduction circuit.

13. The method of claim 12, wherein the microelectronic circuit includes a signal conditioning circuit.

14. The method of claim 12, wherein the microelectromechanical device includes a microphone.

15. The method of claim 12, wherein the microelectromechanical device includes a condenser microphone.

* * * * *